United States Patent [19]

Crookshanks

[11] Patent Number: 4,667,151
[45] Date of Patent: May 19, 1987

[54] CALIBRATED RADIO FREQUENCY SWEEP

[75] Inventor: Rex J. Crookshanks, Palos Verdes Estates, Calif.

[73] Assignee: Hughes Aircraft Company, Los Angeles, Calif.

[21] Appl. No.: 679,322

[22] Filed: Dec. 7, 1984

[51] Int. Cl.$^4$ .............................................. G01R 23/16
[52] U.S. Cl. .................................. 324/77 B; 364/571
[58] Field of Search ............... 364/571, 573, 579; 333/156, 160, 245; 328/184; 324/77 B, 77 C, 77 CS, 77 G, 77 H, 77 K, 78 R

[56] References Cited

U.S. PATENT DOCUMENTS

| 3,693,076 | 9/1972 | Nugent | 324/77 B |
| 3,939,411 | 2/1976 | James | 324/77 H |
| 4,038,612 | 7/1977 | Borofka | 328/184 |
| 4,149,120 | 4/1979 | Richter | 364/573 |
| 4,238,727 | 12/1980 | Madni | 324/77 CS |
| 4,310,816 | 1/1982 | Fuller | 333/245 |
| 4,349,886 | 9/1982 | Ibar | 364/573 |
| 4,446,566 | 5/1984 | Fuller | 324/77 H |

Primary Examiner—Michael J. Tokar
Attorney, Agent, or Firm—J. A. Sawyer, Jr.; M. J. Meltzer; A. W. Karambelas

[57] ABSTRACT

A frequency sweep system (10) operating in the radio frequency range includes a pulse source, a reflective array compresser (RAC) (13) and a complex multiplier (15). The RAC is designed to apply a time dispersion as a monotonic function of frequency to a pulse generated by the pulse source. Since RACs are difficult to manufacture precisely, the complex multiplier is included to compensate for the imperfections in the RAC. The complex multiplier is designed to multiply its analog input by a sequence of complex digital words, including a sign bit, so that the phase and amplitude of the analog signal can be calibrated as required. The sequence of digital words is determined by comparing the desired and actual phase dispersions of the frequency sweep system. The sequence so determined is stored in a read-only memory (ROM) (17). A timing generator (19) coordinates the firing of the pulse and the introduction of the sequence of digital words into the complex multiplier. A limiter (23) is included to reduce amplitude fluctuations as a function of frequency at the RAC output, and to reduce the bandwidth requirements of the processor. A filter (21) is included to smooth the "steps" introduced by the digital processing, so that, for example, an ideal linear frequency sweep can be achieved.

8 Claims, 1 Drawing Figure

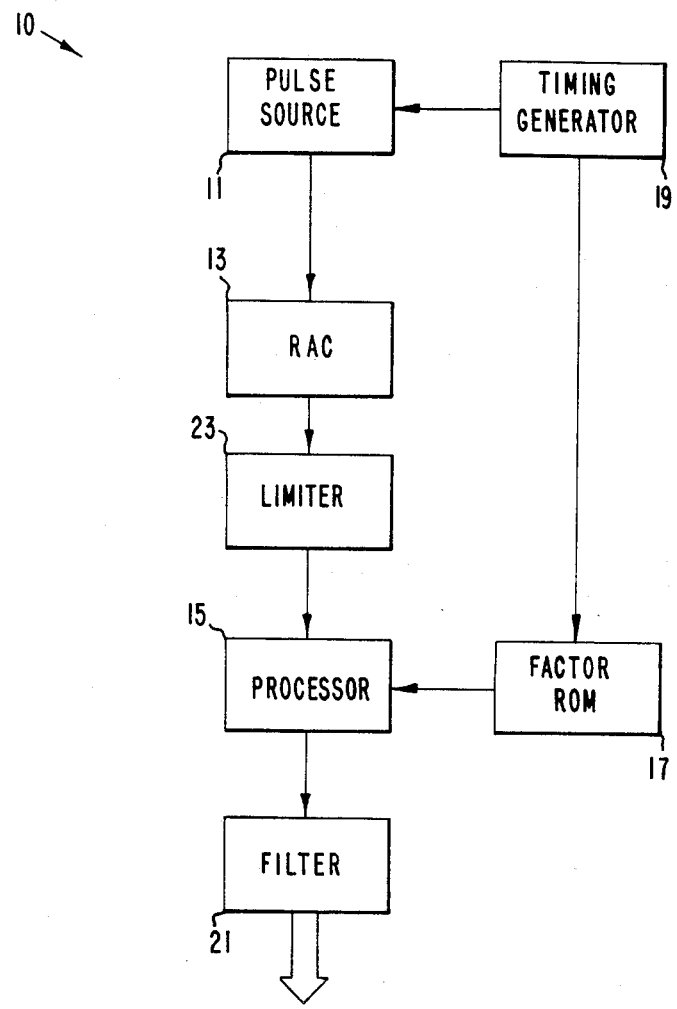

CALIBRATED RADIO FREQUENCY SWEEP

BACKGROUND OF THE INVENTION

The present invention relates to frequency sweeps, and more particularly to such sweeps operating in the radio frequency range.

Many communication devices utilize frequency sweeps, e.g., demodulators, swept receivers and spectrum analyzers. A frequency sweep is a device the output of which is a monotonic frequency function of time.

Frequency sweeps are often produced by time dispersing a pulse as a function of frequency. The pulse is selected to have frequency components over the desired output range of the sweep.

One such dispersion device is a "reflective array compressor" (RAC). The RAC may be manufactured by etching plural slits in a large quartz crystal. The size and placement of the slits determine the dispersion characteristics of the RAC. For example, a RAC may be designed to provide a linear or other specific sweep.

While RACs perform quickly and reliably, they are difficult to manufacture precisely. A RAC designed to produce a linear frequency sweep will generally have some characteristic non-linearities. The cost of manufacturing each RAC typically prohibits large scale rejection of deviating devices.

SUMMARY OF THE INVENTION

In accordance with the present invention, a signal processor adjusts the output of a RAC or other dispersion means to produce a linear or other predetermined frequency sweep. The corrections required to produce the desired sweep are determined according to a method disclosed below and applied by the signal processor to the output of the RAC.

In one realization of the invention, the signal processor multiplies the dispersed output of the RAC by a succession of digital words. Complex digital words can be used so that phase and amplitude can be adjusted, and a sign bit can be included to produce gains as well as attenuations.

A limiter may be inserted between the RAC and the signal processor to limit the amplitude correction required by the signal processor. A timing mechanism can be used to synchronize pulsing with the operation of the signal processor. A smoothing filter can be used to smooth the output of the digital signal processor.

The present invention thus provides a frequency sweep utilizing the advantages of present RAC dispersion devices, and yet offering precision and control in the determination of the shape of the frequency sweep output.

BRIEF DESCRIPTION OF THE DRAWING

FIG. 1 is a schematic of a frequency sweep system in accordance with the present invention.

DESCRIPTION OF THE PREFERRED EMBODIMENTS

A frequency sweep system 10 is shown in FIG. 1 comprising an rf pulse source 11, a RAC 13, and a complex multiplier 15 or other signal processor. The RAC 13 is a dispersion means designed to introduce delays in signals conveyed therethrough; the delays are a monotonic function of frequency. The complex multiplier 15 or other signal processor serves to fine tune the dispersed output of the RAC 13 to a predetermined desired sweep form. In the illustrated embodiment, the output of the frequency sweep system 10 is linear.

In the illustrated embodiment, the complex multiplier 15 or other signal processor is a complex multiplying digital-to-analog converter (MDAC) which introduces a time-varying transfer function to the dispersed pulse. More specifically, the signal processor multiplies the analog signal with a succession of complex digital words, each including a sign bit. This allows modification of the amplitude and phase of the incoming signal as a function of time.

The succession of digital words is stored in a ROM 17 or other information storage means and introduced word-by-word in response to timing signals from a timing generator 19. The timing generator 19 also fires the pulse source 11 so as to synchronize the pulse and succession of digital words.

Since the transfer functions are digital, the output of the signal processor is necessarily stepped. In order to achieve the desired linear sweep, a filter 21 is added to smooth the output.

The complex multiplier 15 or other signal processor can more precisely tune a signal which is already close to the desired frequency sweep. Therefore, the RAC 13 is designed to provide a linear frequency sweep. Furthermore, in order to achieve a constant amplitude frequency sweep, a limiter 23 is inserted between the RAC 13 and the complex multiplier 15 or other signal processor. The limiter 23 also alleviates the bandwidth requirements on the signal processor 15.

The operation of the frequency sweep system 10 is as follows. The timing generator 19 triggers the pulse source 11 to form the pulse containing a full spectrum of frequencies over the desired sweep range. The RAC 13 disperses the pulse according to the monotonic function of frequency. In the illustrated embodiment, the output of the RAC 13 is roughly linear. The limiter 23 equalizes the amplitudes of the signals to provide a constant amplitude, approximately linear, frequency sweep.

The timing generator 19 also provides the address generation for the ROM. In operation, the timing generator 19 steps the ROM 17 through the succession of digital words which are respectively multiplied against segments of the rough sweep. For example, the rough sweep may be divided into 128 adjacent and equal time segments, each of these segments being multiplied by a predetermined digital word. The filter 21 performs an integrating function to enhance the linearity of the sweep by eliminating the steps introduced by successive digital words.

The function, or succession of digital words, stored in the ROM 17 is selected to compensate for the peculiarities in the specific RAC 13. The function is calculated from measurements by a network analyzer which measures phase by frequency shifts introduced between the input to the RAC 13 and the filter output.

In one method of calculating the ROM function, the network analyzer is used to determine the actual phase transfer characteristic of the frequency sweep system with the complex multiplier 15 or other signal processor held at a constant amplitude and phase shift. This actual function is compared with that of an ideal system. The actual function may be expressed as a polynomial expansion of the form:

$$K_0 + K_1 t + K_2 t^2 + R$$

where R is a polynomial with terms of third order and higher. The constants $K_i$ and those in R are complex numbers reflecting both amplitude and phase information. Experience indicates that this polynomial converges rapidly, and that terms greater than 10th order are unnecessary for the present application.

Since frequency is a derivative of phase, the polynomial expansion of the desired phase function of time includes a quadratic term, the constant for which is half the slope of the desired frequency sweep. The constant and linear terms do not affect linearity, but third and higher order terms should be absent. Thus, the ideal function can be expressed:

$$M_0 + M_1 t + M_2 t^2.$$

By subtracting the actual from the ideal, the correction term is obtained:

$$(M_0 - K_0) + (M_1 - K_1)t + (M_2 - K_2)t^2 - R.$$

The function stored in the ROM 17 is e, the natural logarithm, raised to this correction term. This function is evaluated at an appropriate number, 128 in the present case, of instants to produce the succession of digital words. The resulting words are delivered to the processor 15 as dictated by the timing generator 19. The result of the multiplication is the desired linear sweep, except for the steps due to the digital multiplication. As noted above, the filter 21 eliminates these steps.

The values of $M_0$ and $M_1$ represent the amplitude and onset time of the frequency sweep, and may be set accordingly. Otherwise, since the values of $M_0$ and $M_1$ do not affect linearity, they may be set to eliminate the constant and linear terms of the correction terms, i.e., $M_0 = K_0$ and $M_1 = K_1$.

In an alternative method for calculating the ROM function, the complex multiplier 15 or other signal processor is held at a constant amplitude and phase shift, and the transfer characteristic of the frequency from its input to its output is measured using a network analyzer. This function is expanded in a set of complex Legendre polynomials. Experience has indicated that the first ten terms of the expansion form a suitable approximation for the present purposes. Thus, the correction coefficients are calculated by forming the factor:

$$K_{oc} P_o(f,t) \times [K_{oc} P_o(f,t) + K_{1c} P_1(f,t) + K_{2c} P_2(f,t) + \ldots + K_{9c} P_9(f,t)]^{-1}$$

The proper time base in which the above correction factor is used can be determined by measuring the linear and quadratic phase term of the RAC 13 and the limiter 23 and rationing these values against the linear and quadratic phase term of the assembly starting at the input to the RAC 13 and the output of the filter 21.

In accordance with the foregoing, the invention provides rf frequency sweeps with improved performance given the limitations of certain physical components. Many variations and modifications are possible, including different desired sweep patterns, different frequency ranges and slopes, and different approaches to calculating correction factors. Also, dispersion means other than RACs can be employed. These and other embodiments are within the scope of the present invention which is defined in the following claims.

What is claimed is:

1. A frequency sweep, having an output which is a predetermined frequency function of time, comprising:
   a pulse source for providing a pulse;
   dispersion means responsive to said pulse for providing a frequency sweep; and
   calibration means for modifying the output of said dispersion means according to a function of time selected to produce an output which is a predetermined frequency function of time, the calibration means also for multiplying the output of the dispersion means by a succession of digital words.

2. The frequency sweep of claim 1 further characterized in that said digital words are complex digital words.

3. The frequency sweep of claim 1 further characterized in that said digital words include a sign bit.

4. The frequency sweep of claim 1 further comprising a smoothing filter for smoothing the output of calibration means.

5. The frequency sweep of claim 1 further characterized in that said frequency sweep is a linear frequency sweep.

6. The frequency sweep of claim 1 further comprising timing coordinating means for coordinating the introduction of said pulse with the succession of digital words.

7. The frequency sweep of claim 1 further characterized in that said dispersion means is a reflective array compressor.

8. A frequency sweep, having an output which is a predetermined frequency function of time, comprising:
   a pulse source for providing a pulse;
   dispersion means responsive to said pulse for providing a frequency sweep;
   calibration means for modifying the output of said dispersion means according to a function of time selected to produce an output which is the predetermined frequency function of time; and
   a limiter for modifying the output of said dispersion means so that its output conforms to a predetermined amplitude function of frequency, the output of said limiter providing the input to said calibration means.

* * * * *